United States Patent
Sasaki et al.

(10) Patent No.: US 6,444,296 B1
(45) Date of Patent: *Sep. 3, 2002

(54) CONSTITUENT SUBSTRATE FOR ELECTRONIC EQUIPMENT USING WIRING LAYER MADE OF COPPER AND TRANSPARENT CONDUCTIVE LAYER MADE OF COMPOSITE OXIDE CONTAINING INDIUM OXIDE AND METAL OXIDE AS MAIN COMPONENTS AND ELECTRONIC EQUIPMENT USING THE SAME

(75) Inventors: Makoto Sasaki; Kenji Yamamoto, both of Miyagi-ken (JP)

(73) Assignee: LG. Philips LCD Co., Ltd., Seoul (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/385,184

(22) Filed: Aug. 30, 1999

(30) Foreign Application Priority Data

Aug. 31, 1998 (JP) .......................................... 10-246337

(51) Int. Cl.⁷ .............................................. B32B 15/04
(52) U.S. Cl. ...................... 428/209; 428/469; 428/471; 428/697; 428/702

(58) Field of Search ................................ 429/209, 472, 429/469, 697, 699, 701, 702, 901; 501/94; 423/622, 624; 428/471

(56) References Cited

U.S. PATENT DOCUMENTS

| 4,726,965 A | * | 2/1988 | Zondler ........................ 427/98 |
| 4,735,847 A | * | 4/1988 | Fujiwara et al. ............. 428/209 |
| 5,296,653 A | * | 3/1994 | Kiyota et al. ................ 174/250 |
| 5,470,618 A | * | 11/1995 | Ohara et al. ................. 427/529 |
| 5,705,829 A | | 1/1998 | Miyanaga et al. |
| 6,087,205 A | * | 7/2000 | Yamamori ................... 438/158 |

FOREIGN PATENT DOCUMENTS

JP 410034797 A * 2/1998

\* cited by examiner

*Primary Examiner*—Deborah Jones
*Assistant Examiner*—Stephen Stein
(74) *Attorney, Agent, or Firm*—Brinks Hofer Gilson & Lione

(57) ABSTRACT

The present invention provides a constituent substrate for electronic equipment using a wiring layer made of a material which causes no increase in electric resistance value in a contact portion even in direct contact with a transparent conductive layer made of ITO or the like. The constituent substrate for electronic equipment of the present invention uses a wiring layer made of copper, and a transparent conductive layer made of a composite oxide containing indium oxide and an oxide of at least one metal selected from the group consisting of zinc, tin, gallium, thallium, magnesium, and lead as main components.

7 Claims, 6 Drawing Sheets

CONSTITUENT SUBSTRATE FOR ELECTRONIC EQUIPMENT USING WIRING LAYER MADE OF COPPER AND TRANSPARENT CONDUCTIVE LAYER MADE OF COMPOSITE OXIDE CONTAINING INDIUM OXIDE AND METAL OXIDE AS MAIN COMPONENTS AND ELECTRONIC EQUIPMENT USING THE SAME

BACKGROUND OF THE INVENTION

1. Field of the Invention

The present invention relates to a constituent substrate for electronic equipment and electronic equipment using the same, particularly to a constituent substrate for electronic equipment comprising a wiring layer made of copper, and a transparent conductive layer made of a composite oxide comprising indium oxide and a metal oxide as main components.

2. Description of the Related Art

Aluminum as a wiring material has the advantage of low resistance, and is widely used for wiring, electrodes, etc. on a substrate. For a transparent conductive layer used as a transparent electrode or the like, indium tin oxide (abbreviated to "ITO" hereinafter) is generally used.

FIG. 6 is a schematic drawing showing a thin film transistor portion of a general thin film transistor type liquid crystal display device as an example of electronic equipment.

A thin film transistor 82 comprises a gate electrode 84 provided on a substrate 83, and a gate insulation film 85 provided to cover the gate electrode 84. A semiconductor active film 86 made of amorphous silicon (abbreviated to "a-Si" hereinafter) is provided on the gate insulation film 85 above the gate electrode 84, and a source electrode 88 and a drain electrode 89 are provided on the semiconductor active film 86 and the gate insulation film 85 through ohmic contact layers 87 made of amorphous silicon (abbreviated to "n$^+$ type a-Si" hereinafter) containing n-type impurities such as phosphorus or the like over the region ranging from the semiconductor active film 86 to the gate insulation film 85. In addition, a passivation film 90 is provided to cover the thin film transistor 82 comprising the source electrode 88, the drain electrode 89, the gate electrode 84, etc., and a contact hole 91 is provided in the passivation film 90 above the drain electrode 89. Furthermore, a pixel electrode 92 made of ITO and electrically connected to the drain electrode 89 through the contact hole 91 is provided.

Also the sectional structure of a gate terminal pad 93 at the gate wiring end located outside the display region is shown on the left side of FIG. 6. A contact hole 95 is provided above a lower pad layer 94 made of a gate wiring material on the substrate 83 so as to pass through the gate insulation film 85 and the passivation film 90, and an upper pad layer 96 comprising the same transparent conductive layer as the pixel electrode 92 is provided to be electrically connected to the lower pad layer 94 through the contact hole 95. The structure at the source wiring end is also similar to the above-described structure.

As described above, for example, in a thin film transistor, a transparent conductive layer which constitutes the gate terminal, the source terminal, and pixel electrodes, and a wiring metal which constitutes gate wiring, source wiring and the drain electrode are arranged in direct connection to each other.

However, when ITO is used as the transparent conductive layer of electronic equipment, and aluminum is used as the wiring metal, direct contact between ITO and aluminum causes oxidation of aluminum by oxygen contained in ITO, thereby causing the problem of increasing the electric resistance value of the contact portion.

SUMMARY OF THE INVENTION

In consideration of the above-described point, it is an object of the present invention to provide a constituent substrate for electronic equipment using a wiring layer made of a material which causes no increase in electric resistance value of a contact portion even in contact with a transparent conductive layer of ITO or the like, and electronic equipment using the constituent substrate.

A constituent substrate for electronic equipment of the present invention uses a wiring layer made of copper, and a transparent conductive layer made of a composite oxide comprising indium oxide and an oxide of at least one metal selected from the group consisting of zinc, tin, gallium, thallium, magnesium, and lead.

Aluminum and copper have resistivity of 2.7 $\mu\Omega$/cm and 1.6 $\mu\Omega$/cm, respectively, and thus have sufficiently low resistivity as compared with other metals. However, for example, direct connection between aluminum and ITO has a contact resistance of about $10^3$ $\Omega cm^2$, while direct connection between copper and ITO has a contact resistance of about $10^{-7}$ $\Omega cm^2$. There is thus a large difference in contact resistance.

Namely, even when the composite oxide used for the transparent conductive layer and comprising indium oxide and an oxide of at least one metal selected from the group consisting of zinc, tin, gallium, thallium, magnesium, and lead is brought into direct contact with copper used for the wiring layer, the electric resistance value of the contact portion is not increased.

Zinc, tin, gallium, thallium, magnesium, and lead are all elements having transparency and conductivity when oxides thereof form composite oxides with indium oxide. Of these composite oxides, indium zinc oxide is preferably used in the present invention. This is because some of the composite oxides probably cause etching of copper wiring with an etchant used for etching a composite oxide material. However, the copper wiring is not affected by about 0.5 to 5% diluted hydrochloric acid or oxalic acid aqueous solution, which is an etchant for indium zinc oxide. Therefore, in the use of copper as the material for the wiring layer, indium zinc oxide is preferably used as the material for the transparent conductive layer.

The constituent substrate for electronic equipment of the present invention comprises the wiring layer and the transparent conductive layer which are electrically connected.

In this case, the wiring layer and the transparent conductive layer may be brought into direct contact or indirectly contact with a conductor held therebetween.

Electronic equipment of the present invention comprises the above-described constituent substrate for electronic equipment. Examples of electronic equipment using a transparent electrode layer include a thin film transistor type liquid crystal display device, a solar cell, an electroluminescence device, a touch panel, etc. because the transparent electrode layer can be used as an electrode or the like which transmits light.

The electronic equipment comprising the constituent substrate for electronic equipment comprising low-resistance wiring made of copper, and the transparent conductive layer made of a composite oxide containing, as main components, indium oxide and an oxide of at least one metal selected from the group consisting of zinc, tin, gallium, thallium, magnesium, and lead has the following advantages. The electronic equipment can comply with increases in;the area and definition, has excellent performance uniformity and reliability, and can be manufactured by a simple process without the need to insert a barrier metal for decreasing contact resistance between the wiring and the transparent conductive layer, with no wiring defect. and high yield.

DESCRIPTION OF THE PREFERRED EMBODIMENT

Although the present invention is described in detail below with reference to the disclosed the drawings, the present invention is not limited to embodiments.

Figure 1:
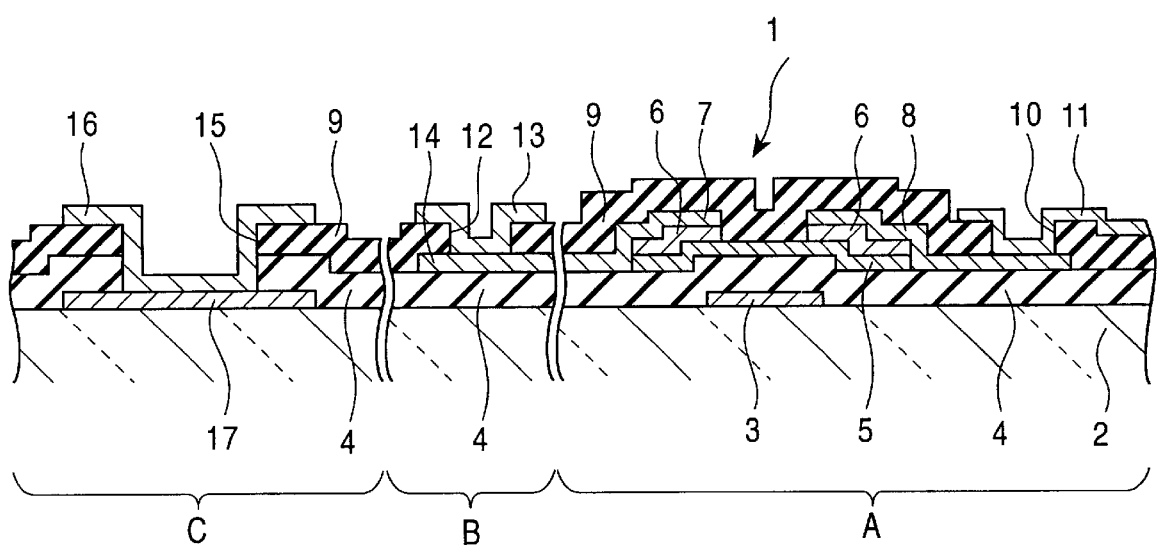
FIG. 1 is a partial sectional view of a thin film transistor substrate as an example of a constituent substrate for electronic equipment in accordance with an embodiment of the present invention.

FIG. 1 is a partial sectional view of a thin film transistor 1 as a example of a constituent substrate for electronic equipment in accordance with an embodiment of the present invention. Reference character A denotes a thin film transistor (abbreviated to "TFT" hereinafter) portion; reference character B, the terminal portion of source wiring located outside the TFT matrix; reference character C, the terminal portion of gate wiring. These three portions are provided at separate positions in an actual liquid crystal display device, and thus the cross-sections thereof cannot be shown in the same drawing. However, for convenience of drawing, the three portions are shown in proximity in FIG. 1.

First the thin film transistor portion A is described.

The thin film transistor portion A comprises a gate electrode 3 provided on a substrate 2 and made of a copper thin film having a thickness of about 1000 Å, and a gate insulation film 4 provided on the gate electrode 3. A semiconductor film 5 made of a-Si is provided on the gate insulation film 4, and an n$^+$ type a-Si layer 6 is further provided on the semiconductor layer 5. A source electrode 7 and drain electrode 8 comprising a copper thin film having a thickness of about 1500 Å are provided on the a-Si layer 6.

A passivation film 9 is formed on the source and drain electrodes 7 and 8 to cover these electrodes, and a contact hole 10 is formed in the passivation film 9. An indium zinc oxide layer (abbreviated to an "IZO layer" hereinafter) 11 is formed along the inner wall and the bottom of the contact hole 10 to form a pixel electrode. The drain electrode 8 is electrically connected to the IZO layer 11 through the contact hole 10.

Next, in the terminal portion B of source wiring, a lower pad layer 14 comprising a copper thin film is formed on the gate insulation film 4, with the passivation film 9 formed on the lower pad layer 14 and a contact hole 12 formed to pass through the passivation film 9. An upper pad layer 13 comprising IZO is formed along the inner wall and the bottom of the contact hole 12. The lower pad layer 14 is electrically connected to the upper pad layer 13 through the contact hole 12.

Next, in the terminal portion C of gate wiring, a lower pad layer 17 comprising a copper thin film is formed on the substrate 2, with the gate insulation film 4 and the passivation film 9 formed on the lower pad layer 17 and a contact hole 15 formed to pass through both layers. An upper pad layer 16 comprising IZO is formed along the inner wall and the bottom of the contact hole 15. The lower pad layer 17 is electrically connected to the upper pad layer 16 through the contact hole 15.

The above-described configuration causes no increase in the electric resistance value of a contact portion even when copper of the wiring layer which constitutes the gate electrode, the source electrode, the drain electrode, etc. is brought into direct contact with the IZO layer which constitutes the pixel electrode, etc. Also copper of the wiring layer is not affected by etching of the IZO layer.

Examples of materials for the passivation film include a-SiN$_x$:H, a-SiN$_x$, a-SiO$_2$:H, SiO$_2$, and the like.

Figure 2A:
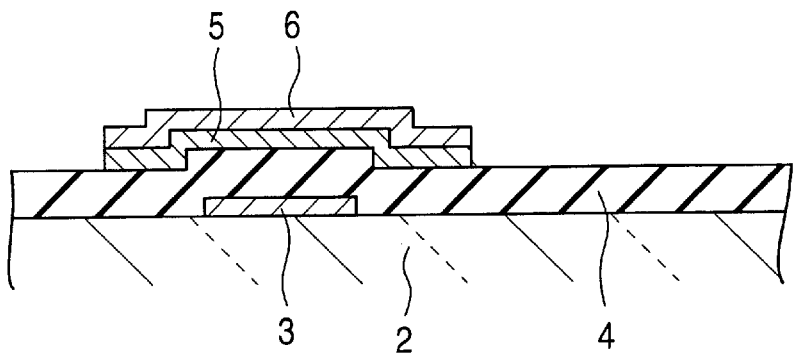
FIG. 2 is a schematic drawing showing the process for manufacturing a constituent substrate for electronic equipment in accordance with an embodiment of the present invention.

The process for manufacturing the constituent substrate 1 for electronic equipment of this embodiment will be described below with reference to FIG. 2. FIGS. 2A, 2B and 2C show the process for manufacturing the thin film transistor portion A.

First, a copper film is formed over the entire surface of the substrate 2 by sputtering, and then etched to form a gate pattern.

Next, the gate insulation film 4, the semiconductor film 5, and the n$^+$-type a-Si layer 6 are formed over the upper side of the substrate by the CVD method. Then, the semiconductor film 5 and the n$^+$-type a-Si layer 6 are etched to leave portions thereof above the gate electrode 3, which constitute a channel portion, as shown in FIG. 2A.

Figure 2B:
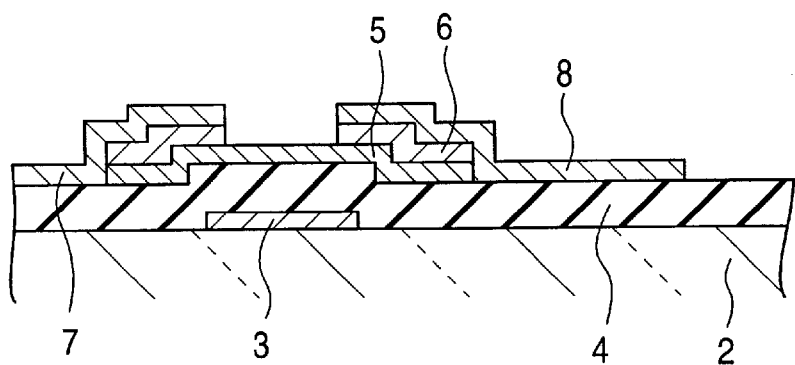

Then, as shown in FIG. 2B, copper is deposited for forming the source and drain electrodes 7 and 8, and the copper film and the n$^+$-type a-Si layer 6 above the gate electrode 3 are etched to form the source and drain electrodes 7 and 8, and a channel.

Figure 2C:
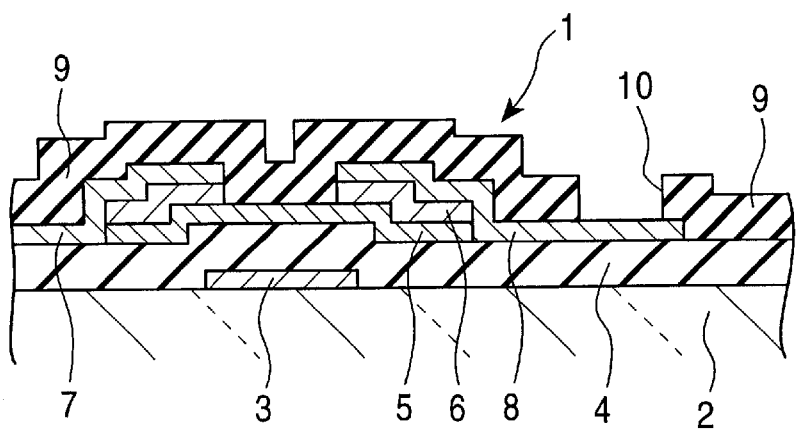

Next, the passivation film 9 is formed on these layers, and then etched to form the contact hole 10, as shown in FIG. 2C.

Then, an IZO layer is formed over the entire surface, and then patterned to form the IZO layer 11 over the bottom and the inner wall of the contact hole 10, and the upper side of the passivation film.

In the terminal portion B of the source wiring, and the terminal portion C of the gate wiring, similarly, the passivation film 9 is formed on the gate insulation film 4, and then the passivation film 9 and the gate insulation film 4 are etched to form the contact holes 12 and 15. The IZO layer is formed over the entire surface, and then patterned to form the upper pad layers 13 and 16 over the bottoms and the inner walls of the contact holes 12 and 15, and the upper side of the passivation film.

According to the above procedure, the thin film transistor substrate 1 as an example of the constituent substrate for electronic equipment of this embodiment can be amanufactured.

The constituent substrate for electronic equipment of this embodiment exhibits the following effects.

Since the constituent substrate for electronic equipment of this embodiment comprises the wiring layer made of copper, and the transparent conductive layer made of IZO, the electric resistance value of a contact portion is not increased even when copper of the wiring layer is brought into direct contact with IZO.

Also, copper of the wiring layer is not etched under acidic conditions for etching IZO, thereby causing no defect in wiring.

Although, for example, a nitric acid/hydrochloric acid system, a sulfuric acid/hydrochloric acid system, or the like is used as an etchant for ITO, copper wiring is also possibly etched with such an etchant. However, 0.5 to 5% diluted hydrochloric acid or oxalic acid aqueous solution is used as an etchant for IZO, and thus the copper wiring is not affected by such an etchant. Therefore, in the use of copper as the material for the wiring layer, indium zinc oxide is preferably used as the material for the transparent conductive layer.

The constituent substrate for electronic equipment of this embodiment can be applied to various types of electronic equipment, for example, such as a thin film transistor type liquid crystal display device, a solar cell, an electroluminescence device, a touch panel, and the like.

Figure 3:
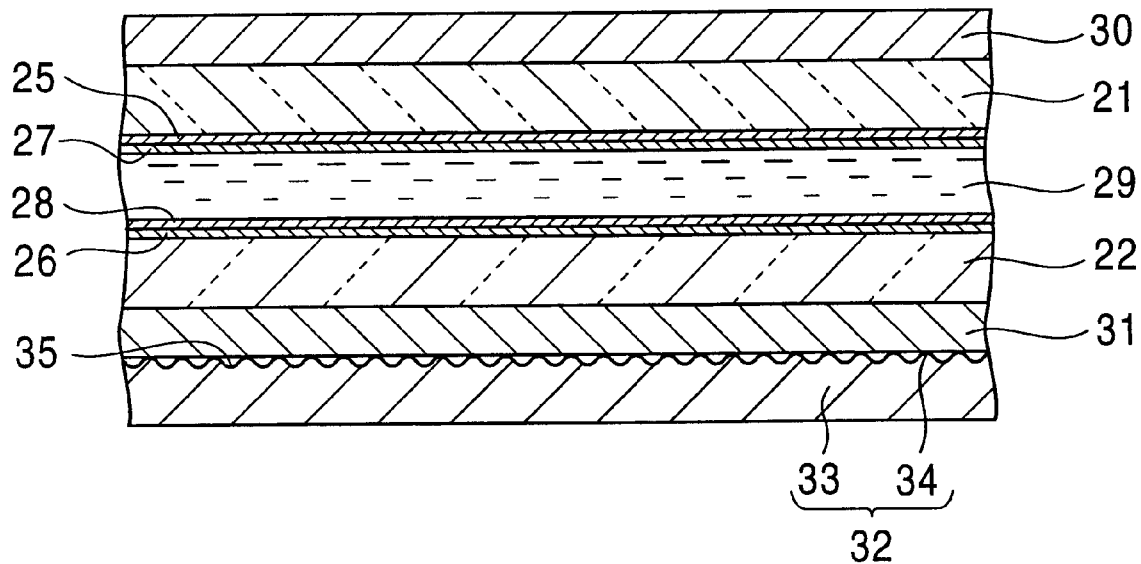
FIG. 3 is a schematic drawing showing an example of a reflective liquid crystal display device using a constituent substrate for electronic equipment in accordance with an embodiment of the present invention.

FIG. 3 is a schematic drawing showing an example of a reflective liquid crystal display device using the constituent substrate for electronic equipment of this embodiment.

The reflective liquid crystal display device comprises upper and lower glass substrates 21 and 22 opposite to each other with a liquid crystal layer 29 held therebetween, an upper transparent electrode layer 25 and an upper alignment film 27, which are provided on the inner side of the upper glass substrate 21 in this order from the upper glass substrate side, and a lower transparent electrode layer 26 and a lower alignment film 28, which are provided on the inner side of the lower glass substrate 22 in this order from the lower glass substrate side.

The liquid crystal layer 29 is provided between the upper and lower alignment films 27 and 28. An upper polarizer 30 is provided on the outer side of the upper glass substrate 21, and a lower polarizer 31 is provided on the outer side of the lower glass substrate 22. Furthermore, a reflector 32 is provided on the outer side of the lower polarizer 31 so that an uneven surface 35 of a reflecting film 34 faces the lower polarizer side. The reflector 32 is formed by, for example, depositing, by vapor deposition or the like, the metal reflecting film 34 made of aluminum or silver on the uneven surface of a polyester film 33 having the randomly uneven surface, so that the reflector 32 has the randomly uneven surface 35.

In the reflective liquid crystal display device, the lower glass substrate 22 corresponds to the substrate 2 of the thin film transistor substrate 1 of this embodiment, and the lower transparent electrode layer 26 corresponds to the ITO layer (pixel electrode) 11.

Figure 4A:
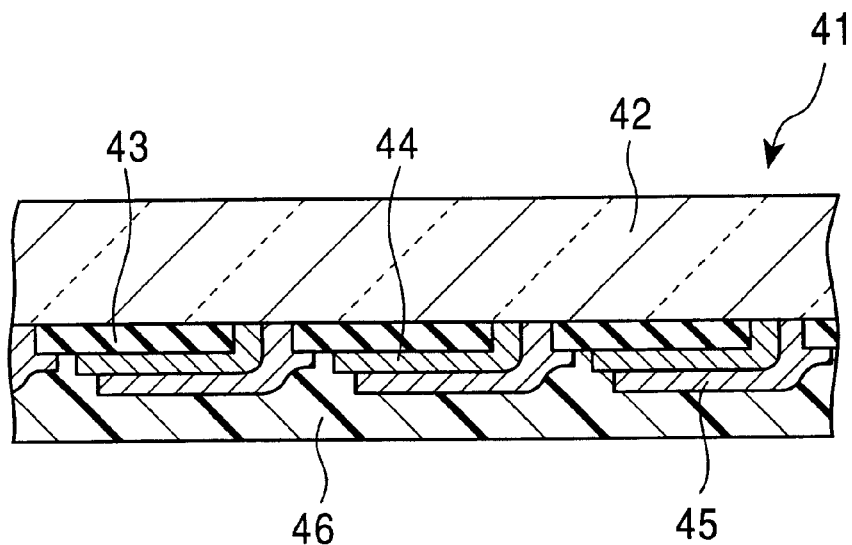
FIGS. 4A and 4B are an enlarged sectional view and a sectional view, respectively, showing the construction of an example of various power modules using a-Si solar cells comprising a constituent substrate for electronic equipment in accordance with an embodiment of the present invention.
Figure 4B:
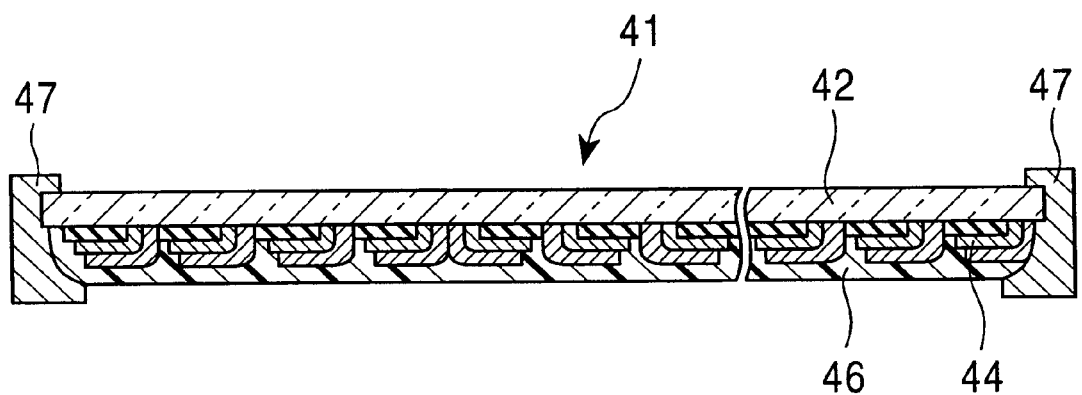

FIGS. 4A and FIG. 4B are an enlarged sectional view and a sectional view, respectively, showing an example of the construction of various power modules using a a-Si solar cell comprising the constituent substrate for electronic equipment of this embodiment.

As shown in FIG. 4A, a module 41 using a a-Si solar cell comprises a glass substrate 42, transparent electrodes 43, a-Si 44, rear electrodes 45, and a resin 46. The transparent electrodes 43 are made of IZO, and the rear electrodes 45 are made of copper.

As shown in FIG. 4A, the transparent electrode 43, the a-Si 44, and the rear electrode 45 are laminated to form one unit. As shown in FIG. 4B, many units are connected in series to form the module 41. The ends of the module 41 are fixed by an outer frame 47.

As shown in FIG. 4A, in each of the connection portions between the respective units, the transparent electrode 43 is brought into direct contact with the rear electrode 45. However, since the transparent electrode 43 is made of IZO, and the rear electrode 45 is made of copper, the electric resistance of the contact portion is kept to a low value.

Figure 5:
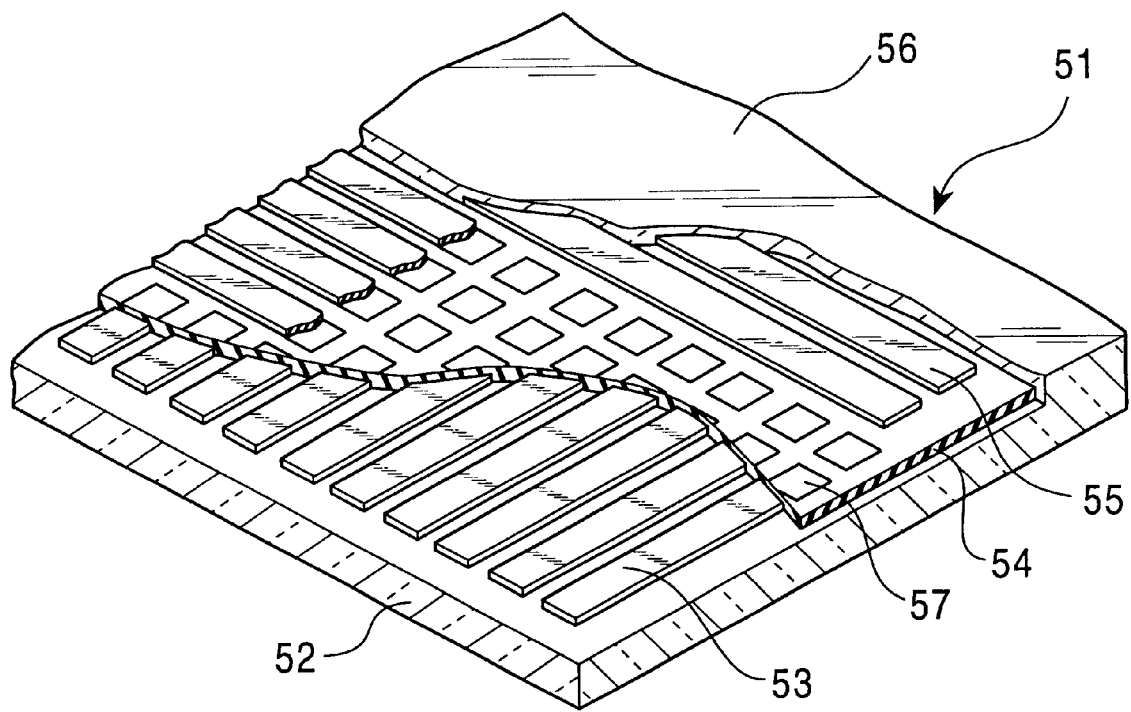
FIG. 5 is a partially broken out drawing showing the structure of an example of electroluminescence devices using a constituent substrate for electronic equipment in accordance with an embodiment of the present invention.
Figure 6:
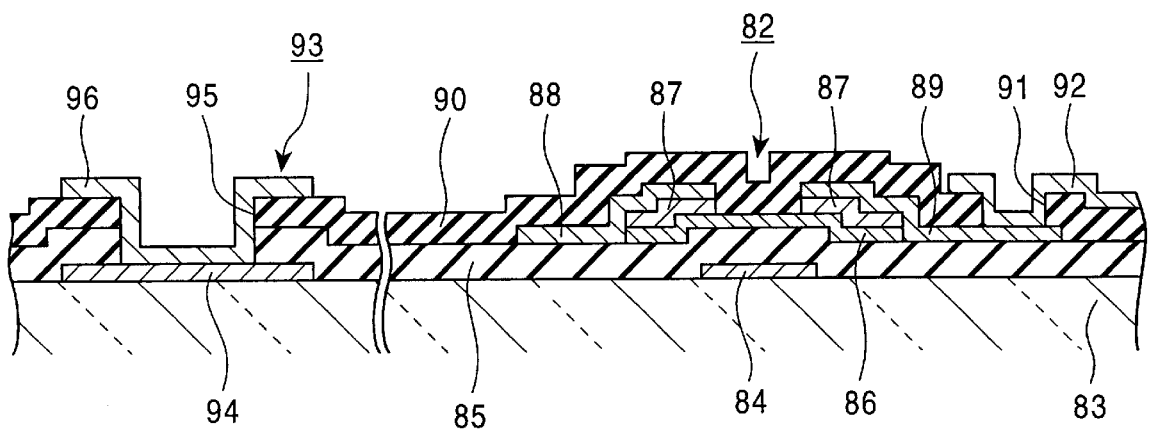
FIG. 6 is a sectional view showing the structure of a conventional thin film transistor.

FIG. 5 is a partially broken-out drawing showing an example of the structure of an electroluminescence device (abbreviated to an "EL device" hereinafter) using the constituent substrate for electronic equipment of this embodiment.

As shown in FIG. 5, an EL device 51 comprises strip copper electrodes (Y electrodes) 53 arranged in parallel on a glass substrate 52, and a plate-shaped picture element separating insulation layer 54 arranged on the copper electrodes 53. Strip transparent electrodes (X electrodes) 55 are arranged in parallel on the insulation layer 54 perpendicularly to the copper electrodes 53, and a moisture-proof protecting layer 56 is provided to cover the whole. The regions of the picture element separating insulation layer 54, which are held between the copper electrodes 53 and the transparent electrode 55, constitute EL layers 57. The transparent electrodes 55 are made of IZO.

In the signal input terminal (not shown) at the end of the glass substrate 52, the copper electrodes 53 and the transparent electrodes 55 are present at adjacent positions. In this case, the etchant for etching the transparent electrodes 55 has no effect on the copper electrodes 53; for example, the copper electrodes 53 are not etched at the same time.

The technical scope of the present invention is not limited to the above-described embodiments, and various modifications can be made in the scope of the gist of the invention. Although the embodiments use IZO for the transparent conductive layer, for example, a composite oxide comprising indium oxide and an oxide of at least one metal selected from the group consisting of zinc, tin, gallium, thallium, magnesium, and lead as main components can appropriately be used.

As described in detail above, the constituent substrate for electronic equipment of the present invention comprises the transparent conductive layer made of a composite oxide comprising indium oxide and an oxide of at least one metal selected from the group consisting of zinc, tin, gallium, thallium, magnesium, and lead as main components, so that the electric resistance value of a contact portion is not increased even when copper used for the wiring layer is brought into direct contact with the composite oxide.

In addition, in the use of indium zinc oxide for the transparent conductive layer, copper of the wiring layer is not etched under acidic conditions for etching the indium zinc oxide, thereby causing no disconnection defect.

Electronic equipment comprising a constituent substrate for electronic equipment comprising low-resistance wiring made of copper, and a transparent conductive layer made of a composite oxide comprising, as main components, indium oxide and an oxide of at least one metal selected from the group consisting of zinc, tin, gallium, thallium, magnesium, and lead has the following advantages. The electronic equipment can comply with needs for increasing the area and definition, has excellent performance uniformity and reliability, and can be produced by a simple process having no need to insert a metal barrier for decreasing contact resistance between the wiring and the transparent conductive layer with no wiring defect and high yield.

What is claimed is:

1. A constituent substrate for electronic equipment comprising a wiring layer made of copper, and a transparent conductive layer including a composite oxide comprising indium oxide and an oxide of at least one metal selected from the group consisting of zinc, tin, gallium, thallium, magnesium and lead as main components on and in contact with the copper wiring layer, and wherein the wiring layer and the transparent conductive layer are disposed on a substrate layer.

2. A constituent substrate for electronic equipment according to claim 1, wherein the composite oxide is indium zinc oxide.

3. A constituent substrate for electronic equipment according to claim 1, wherein the wiring layer is brought into direct contact with the transparent conductive layer.

4. Electronic equipment comprising a constituent substrate for electronic equipment according to claim 1.

5. A pad layer for electronic equipment comprising:

a first wiring layer made of copper;

a second wiring layer on and in contact with the first wiring layer, the second wiring layer including a transparent conductive layer made of a composite oxide comprising an indium oxide, and oxide of at least one metal selected from the group consisting of zinc, tin, gallium, thallium, magnesium and lead as main components on the copper; and a substrate layer disposed below the first wiring layer and the transparent conductive layer.

6. The pad layer for electronic equipment according to claim 1, wherein the composite oxide is indium zinc oxide.

7. The pad layer for electronic equipment according to claim 1, wherein the first wiring layer directly contacts the transparent conductive layer.

* * * * *